US009941381B2

(12) United States Patent
Qu et al.

(10) Patent No.: US 9,941,381 B2
(45) Date of Patent: Apr. 10, 2018

(54) SEMICONDUCTOR DEVICE HAVING A TRENCH MOS BARRIER SCHOTTKY DIODE

(71) Applicant: Robert Bosch GmbH, Stuttgart (DE)

(72) Inventors: Ning Qu, Reutlingen (DE); Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 26 days.

(21) Appl. No.: 15/062,916

(22) Filed: Mar. 7, 2016

(65) Prior Publication Data

US 2016/0268255 A1 Sep. 15, 2016

(30) Foreign Application Priority Data

Mar. 9, 2015 (DE) ........................ 10 2015 204 138

(51) Int. Cl.
| | |
|---|---|
| *H01L 29/49* | (2006.01) |
| *H01L 29/66* | (2006.01) |
| *H01L 29/872* | (2006.01) |
| *H01L 29/06* | (2006.01) |
| *H01L 29/16* | (2006.01) |
| *H01L 29/20* | (2006.01) |

(52) U.S. Cl.
CPC .... *H01L 29/66143* (2013.01); *H01L 29/0619* (2013.01); *H01L 29/0623* (2013.01); *H01L 29/872* (2013.01); *H01L 29/1608* (2013.01); *H01L 29/20* (2013.01)

(58) Field of Classification Search
CPC .................................................. H01L 27/0676
See application file for complete search history.

(56) References Cited

U.S. PATENT DOCUMENTS 6,621,107 B2 * 9/2003 Blanchard ........... H01L 29/7806
257/155

FOREIGN PATENT DOCUMENTS

DE 10 2004 053 760 5/2006

* cited by examiner

*Primary Examiner* — Michael Shingleton
(74) *Attorney, Agent, or Firm* — Norton Rose Fulbright US LLP; Gerard Messina

(57) ABSTRACT

A semiconductor device having a trench MOS barrier Schottky diode includes a semiconductor volume of a first conductivity type, the semiconductor volume (i) having a first side which is covered with a metal layer, and (ii) including at least one trench which extends in the first side and is at least partially filled with metal and/or with a semiconductor material of a second conductivity type. The trench has at least one wall section which includes an oxide layer, at least in areas. At least one area, situated next to the trench, of the first side covered with the metal layer has a layer, situated between the metal layer and the semiconductor volume, made of a first semiconductor material of the second conductivity type.

7 Claims, 3 Drawing Sheets

SEMICONDUCTOR DEVICE HAVING A TRENCH MOS BARRIER SCHOTTKY DIODE

BACKGROUND OF THE INVENTION

1. Field of the Invention

The present invention relates to a semiconductor device having a trench MOS barrier Schottky diode.

2. Description of the Related Art

Such a semiconductor device in the form of a trench MOS barrier Schottky diode is known from published German patent application document DE 10 2004 053 760 A1, and includes a semiconductor volume of a first conductivity type, the semiconductor volume having a first side which is covered with a metal layer, and including at least one trench which extends in the first side and is filled with doped polysilicon. In addition, on its wall the trench has at least one wall section which includes an oxide layer.

Schottky diodes usually include metal semiconductor contacts or silicide semiconductor contacts. In Schottky diodes, high-level injection does not take place in conducting mode, and therefore there is no clearing of the minority charge carriers upon shutoff. Schottky diodes switch comparatively rapidly and with little power loss. The term "high-level injection" refers to a state in which the density of the injected minority charge carriers comes into the range of the majority charge carriers.

However, Schottky diodes have relatively high leakage currents, in particular at higher temperatures, with a strong voltage dependency due to the so-called barrier lowering effect. In addition, for high reverse voltages, thick, low-doped semiconductor layers are generally necessary, which at high currents result in comparatively high conducting-state voltages. For this reason, power Schottky diodes in silicon technology, despite good switching behavior, are not suited or are only slightly suitable for voltages above approximately 100 V.

BRIEF SUMMARY OF THE INVENTION

The semiconductor device according to the present invention differs from the related art mentioned at the outset, and is therefore characterized in that at least one area, situated next to the trench, of the first side covered with the metal layer has a layer, situated between the metal layer and the semiconductor volume, made of a first semiconductor material of a second conductivity type.

The semiconductor device according to the present invention may advantageously be used for high-voltage applications, the semiconductor device at the same time having a comparatively low conducting-state voltage, a comparatively low leakage current or cutoff current, and comparatively small switching losses. In addition, the semiconductor device has comparatively great robustness during operation.

An additional barrier oxide structure (trench MOS structure) is achieved with the aid of the aforementioned oxide layer. In addition, it may be provided according to the present invention that a metal layer is used instead of the p-doped trench filling. The additional barrier oxide structure may also include, for example, two or even more metal layers, which are preferably different, situated one upon the other with respect to a depth of the trench.

The semiconductor device according to the present invention is also referred to here as a "TMBS-PN-P." "TMBS" refers to the trench MOS Schottky barrier Schottky diode, which is designed using the oxide layer. Furthermore, "PN" refers to a PN diode which acts in parallel to the TMBS, and "P" refers to the layer made of the first semiconductor material of the second conductivity type, which according to the present invention is situated between the metal layer and the semiconductor volume. In the present case, "P" stands for a layer of the p conductivity type. For designs with a complementary structure, this would be an "N" layer.

Properties of the trench MOS barrier Schottky diode together with the PN diode are initially described below, i.e., initially without regard for the layer according to the present invention made of semiconductor material of a second conductivity type. However, this description is essentially also transferable to the semiconductor device according to the present invention, the semiconductor device according to the present invention sometimes having much better electrical properties, as already described above.

From an electrical standpoint, the semiconductor device according to the present invention is a combination of a MOS structure (corresponding to the metal layer, the oxide layer, and the semiconductor volume), a Schottky diode (Schottky barrier between the metal layer and the semiconductor volume, the metal layer acting, for example, as an anode and the semiconductor volume acting as a cathode, as a function of the particular conductivity type), and a PN diode (as will be explained below). At the same time, the metal layer acts as an electrode for the Schottky diode and likewise as an electrode for the PN diode, the electrode in each case being an anode, for example. Doping of the semiconductor volume (which is designed, for example, as an epitaxially built-up layer, for example as a so-called "n epilayer") is selected in such a way that during operation with high currents, high-level injection of charge carriers takes place in the metal layer in the conducting direction.

In the TMBS-PN, initially the currents flow in the conducting direction only through the Schottky diode. With increasing currents, conducting-state currents increasingly flow also through the PN junction. The parallel connection of the Trench MOS Schottky structure with the PN diode ensures that in conducting mode, the charge carrier concentration in the weakly doped area is much higher than that in a Schottky diode, but much lower than that in a PiN diode. An optimization is thus achieved between conducting-state voltage on the one hand and switching loss on the other hand.

In addition, the TMBS-PN offers great robustness due to a so-called "clamp function" which is made possible with the aid of the PN diode. A breakdown voltage of the PN diode is preferably designed in such a way that it is lower than the breakdown voltage of the Schottky diode and lower than the breakdown voltage of the MOS structure. The semiconductor device according to the present invention is preferably designed in such a way that it may be operated with comparatively high currents in the breakdown state.

In addition, the TMBS-PN is preferably designed in such a way that no so-called "charge compensation" can take place between the semiconductor volume ("n epilayer") and the second semiconductor material of the second conductivity type (at the base of the trench), and likewise, in such a way that an electrical "breakdown" takes place at a base of the trenches. In breakdown mode, currents then flow only through the PN junctions, and not through the inversion layer of the MOS structure.

The TMBS-PN thus has similar robustness to a PN diode. In addition, in a TMBS-PN there is no concern for an injection of so-called "hot" charge carriers, since the high field strength during the breakdown is not situated in the vicinity of the MOS structure. Therefore, the TMBS-PN is suitable as a Z diode, in particular for use in generator systems of motor vehicles.

On the other hand, despite the trench structure for shielding the Schottky effects, the nature of a Schottky diode is partially maintained in the TMBS-PN. In addition, a leakage current or cutoff current, in particular at high temperature, is much higher than that for a PiN diode ("PiN" means a PN diode having an intrinsic area which is situated between the p-doped area and the n-doped area, and which is not doped or is only weakly doped).

The properties of the trench MOS barrier Schottky diode together with the PN diode and together with the layer according to the present invention, made of a first semiconductor material of a second conductivity type (referred to here as "TMBS-PN-P"), are now described below.

The present invention allows novel, highly blocking power diodes (TMBS-PN-P) in silicon trench technology (or made of some other semiconductor material) which, compared to conventional PiN power diodes, have much smaller shutoff losses at lower conducting-state voltages, and compared to the TMBS-PN, have much lower cutoff currents with virtually the same conducting-state voltages and switching losses.

In addition, the layer (also referred to here as a "thin p layer"), made of the first semiconductor material of the second conductivity type which is situated between the metal layer and the semiconductor volume, allows additional shielding of the Schottky contact directly beneath the Schottky contact. Cutoff currents, in particular at high temperature, may thus be greatly reduced without increasing the conducting-state voltage and/or the switching losses.

The semiconductor device according to the present invention, as already described above, preferably includes a semiconductor volume with at least two trenches. In particular when the at least two trenches are situated comparatively close to one another, advantageous effects may result which further enhance the properties of the semiconductor device.

The at least two trenches preferably have a strip-shaped, i.e., elongated, design. It is also preferred that the at least two trenches are situated essentially next to one another in parallel at a comparatively small distance from one another. Alternatively, the trenches may be designed in concentrated form ("island-shaped"), for example in the shape of a circle or hexagon.

The advantage of the adjacent arrangement of the at least two trenches lies in a reduction of the cutoff currents. In the MOS structure as well as in the Schottky diode and in the PN diode, space charge regions form in the reverse direction. The space charge regions expand with increasing reverse voltage, and at a voltage which is less than the breakdown voltage of the TMBS-PN, collide in the middle of an area between adjacent trenches. The Schottky effects responsible for the high cutoff currents are thus shielded, and the cutoff currents are reduced.

This shielding effect is greatly dependent on structural parameters. This relates in particular to a depth of a wall section of the particular trench which is covered with the oxide layer, and to a clearance between the trenches, a width of the particular trench or a width of a volume which characterizes the PN diode, or a depth dimension of the volume which characterizes the PN diode (for example, a depth dimension of a trench section with p-doped semiconductor material, "p trough," or a polysemiconductor material), and a layer thickness of the oxide layer. The extension of the space charge regions in a so-called "mesa area" between the trenches is one-dimensional in a manner of speaking, provided that the depth of the trench is much greater than the distance between the trenches. The shielding action for the Schottky effect is therefore much more effective in the TMBS-PN compared to conventional Schottky diodes (junction barrier Schottky (JBS) diode) with diffused p troughs.

In one embodiment of the semiconductor device, at least one area of a base of the at least one trench is filled with a second semiconductor material, the second semiconductor material being a semiconductor material of the second conductivity type. This makes possible the PN diode, having the advantages described above, which is integrated into the semiconductor device.

Additionally or alternatively, it may be provided that an area of a base of the at least one trench is converted into a second semiconductor material of the second conductivity type with the aid of ion implantation. A PN junction or the aforementioned PN diode may thus likewise be made possible.

In addition, it may be provided that a second side of the semiconductor volume, facing away from the first side covered with the metal layer, is covered with an electrically conductive contact material, and a partial volume of the semiconductor volume bordering the contact material is more strongly doped than the remaining semiconductor volume of the first conductivity type. The partial volume is in particular a so-called "n+ substrate" (for inverse doping of the semiconductor device, it is a "p+ substrate"), as is similarly known from the related art. The metal layer described above may be used as a first electrode (anode electrode), and the aforementioned contact material (which is preferably likewise designed as a metal or as a metal layer) may be used as a second electrode (cathode electrode). Overall, a particularly suitable design for the semiconductor device according to the present invention is thus described.

The semiconductor device is preferably designed in such a way that the metal layer is separated in sections from the semiconductor volume of the first conductivity type, either by the oxide layer or the layer made of the first semiconductor material of the second conductivity type or the second semiconductor material of the second conductivity type. This means in particular that the metal layer and the semiconductor volume do not directly adjoin one another, which results in advantageous properties for the semiconductor device according to the present invention.

In addition, it may be provided that the first semiconductor material of the second conductivity type has a layer thickness in a range of 10 nm to 500 nm. Furthermore, it may be provided that a doping concentration of the first semiconductor material of the second conductivity type is in a range of $10^{16}$ atoms per cubic centimeter to $10^{17}$ atoms per cubic centimeter. Such thin layers, in particular together with the stated doping concentration, are particularly suitable for making possible a comparatively low cutoff current, a comparatively low conducting-state voltage, and comparatively small switching losses of the diode according to the present invention.

In another embodiment of the semiconductor device, a depth of the at least one trench is 1 µm to 4 µm, preferably approximately 2 µm, in particular 1.5 µm to 2.5 µm. This dimension is particularly suitable, for example, for use of the diode according to the present invention for a rectifier system in motor vehicles. However, the use is not limited to typical vehicle electrical system voltages. For example, a reverse voltage of the diode according to the present invention of approximately 600 volts may be achieved with the stated dimensions. A further advantageous dimensioning of the semiconductor device results when a ratio of a depth of the trench to a clearance between two trenches in each case is greater than or equal to approximately 2, in particular 1.5 to 2.5.

In a first variant of the semiconductor device according to the present invention, it is provided that the first conductivity type is an n conductivity, which an n-doped semiconductor material has, and the second conductivity type is a p conductivity, which a p-doped semiconductor material has. In a second alternative variant, it is provided that the first conductivity type is a p conductivity, and the second conductivity type is an n conductivity. The functions of the anode and of the cathode are correspondingly interchanged. Thus, in principle the semiconductor device is suitable for both mutually complementary embodiments of the semiconductor material.

Moreover, the present invention encompasses a method for manufacturing the semiconductor device having a trench MOS barrier Schottky (TMBS) diode, characterized by the following steps:

creating a first semiconductor volume ("partial volume") of a first conductivity type, which is comparatively strongly doped; this takes place, for example, with the aid of an epitaxy process and doping which takes place concurrently or subsequently;

creating a subsequent second semiconductor volume of the same conductivity type but having a lower doping concentration; this takes place, for example, with the aid of an epitaxy process; alternatively, initially the second semiconductor volume is created with relatively weak doping, and a partial volume thereof is subsequently doped more strongly, so that the first semiconductor volume, which is comparatively strongly doped, results in the partial volume;

etching at least one trench into the semiconductor volume;

creating an oxide layer on at least one wall section of the trench;

removing at least one section of the oxide layer, preferably in an area of a base of the trench;

creating a semiconductor volume of the second conductivity type, preferably in the area of the base of the trench, using semiconductor material of the second conductivity type, and doping the semiconductor volume with a dopant which increases the conductivity of the second conductivity type;

filling at least a portion of a remaining volume of the at least one trench with a metal or preferably with a polycrystalline semiconductor material of the second conductivity type;

creating a layer made of a semiconductor material of a second conductivity type on the semiconductor volume of the first conductivity type on a side of the semiconductor volume facing away from the comparatively strongly doped first partial volume;

creating a metal layer on the layer made of semiconductor material of the second conductivity type and on the metal or polycrystalline semiconductor material, which fills at least a portion of the remaining volume of the trench;

creating an electrically conductive contact material, in particular a metal or metal layer, on a side of the semiconductor volume facing away from the metal layer;

carrying out additional manufacturing steps such as bonding and/or housing and/or contacting of the semiconductor device.

It is understood that the method according to the present invention may also be carried out with comparatively minor modifications known to those skilled in the art. For example, it is conceivable to create the oxide layer only in a predefined area of the wall sections of the trench, so that it does not have to be subsequently partially removed again.

The semiconductor device according to the present invention is preferably manufactured, at least in part, with the aid of an epitaxy process and/or with the aid of an etching process and/or with the aid of an ion implantation process. Advantageous options for manufacturing the semiconductor device according to the present invention are thus described.

In addition, the present invention is not limited to a silicon semiconductor material, and additionally or alternatively may include further semiconductor materials, in particular a silicon material and/or a silicon carbide material and/or a silicon-germanium material and/or a gallium arsenide material.

Furthermore, instead of the silicon oxide layer, a thin layer made of some other dielectric, for example silicon nitride, aluminum oxide, hafnium oxide, or other combinations of different dielectric layers, may be situated on wall sections of the trenches.

Specific embodiments of the present invention are explained below by way of example, with reference to the drawings.

DETAILED DESCRIPTION OF THE INVENTION

Figure 1:
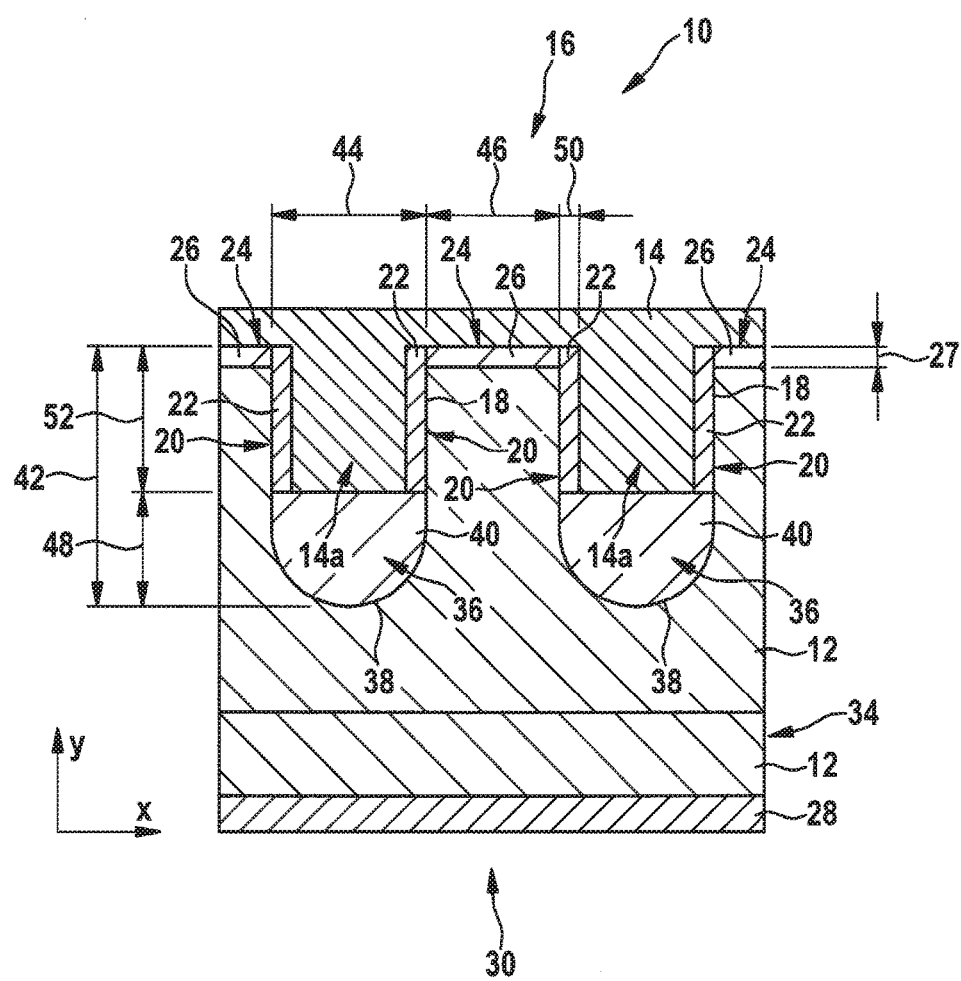
FIG. 1 shows a simplified sectional view of a first specific embodiment of a semiconductor device having a trench MOS barrier Schottky diode and an integrated PN diode.

The same reference numerals are used in all figures for functionally equivalent elements and parameters, even for different specific embodiments.

Figure 2:
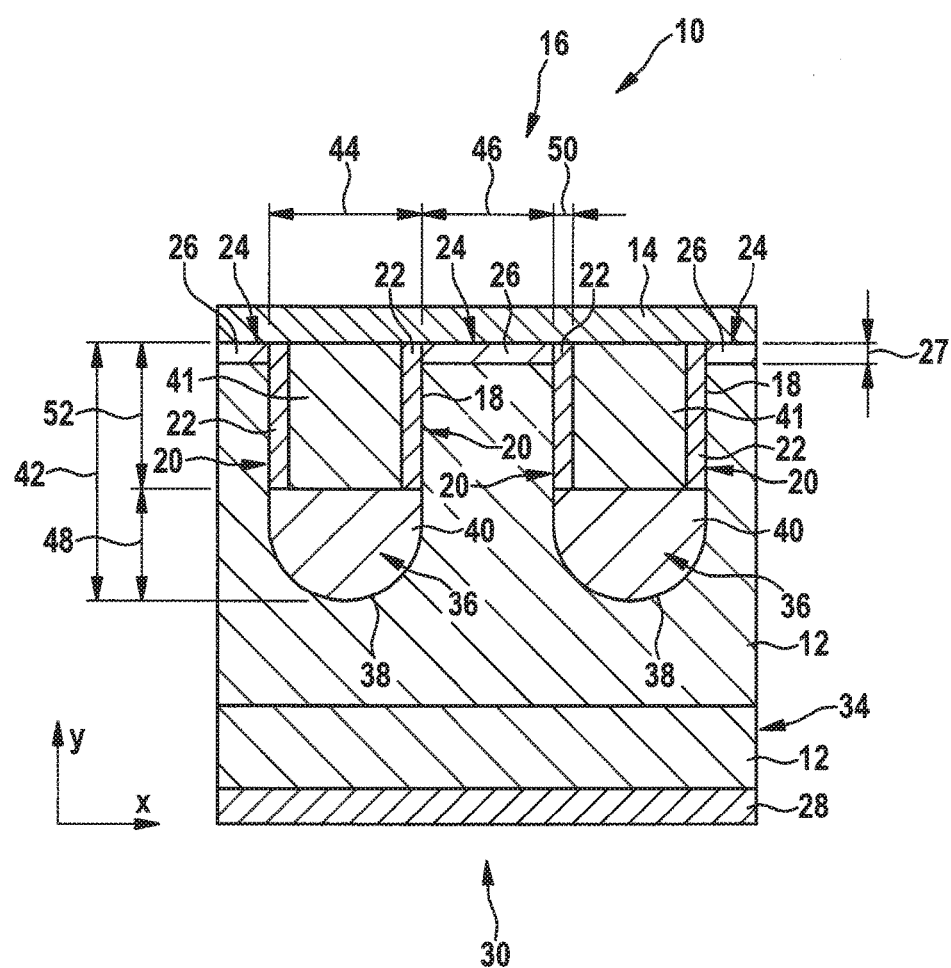
FIG. 2 shows a simplified sectional view of a second specific embodiment of the semiconductor device having a trench MOS barrier Schottky diode and an integrated PN diode.

FIG. 1 shows a first specific embodiment of a semiconductor device 10 having a trench MOS barrier Schottky diode, which includes: a semiconductor volume 12 of a first conductivity type, semiconductor volume 12 including a first side 16 covered with a metal layer 14 (at the top in FIG. 1) and at least one trench 18 which extends in first side 16 and which is filled, at least partially, with metal 14a (in the present case, metal 14a in each case corresponds to a section of metal layer 14) and/or with a semiconductor material 40 and 41 (see FIG. 2). As is apparent in FIG. 1, in the present case semiconductor volume 12 has two such trenches 18. Trenches 18 each have a width 44.

In the present case, a depth 42 of the at least one trench 18 is approximately 2 microns (μm). In alternative specific embodiments of semiconductor device 10, depth 42 is 1 μm to approximately 4 μm. In addition, a ratio of depth 42 of trench 18 to a clearance 46 between two trenches 18 in each case is greater than or equal to approximately 2. In one alternative specific embodiment of semiconductor device 10, this ratio may also be less than 2.

(Lateral) wall sections 20 of trenches 18 include an oxide layer 22, at least in areas. In the present case, oxide layer 22 is characterized by a layer thickness 50 and a depth dimension 52. An additional barrier oxide structure (trench MOS structure) is implemented with the aid of oxide layer 22.

According to the present invention, areas 24 of first side 16 which are covered with metal layer 14 and situated next to trenches 18 include a layer, situated between metal layer 14 and semiconductor volume 12, made of a first semiconductor material 26 of a second conductivity type. This results in several advantages for the trench MOS barrier Schottky diode which is implemented with the aid of semiconductor device 10, in particular a comparatively low conducting-state voltage, a comparatively low leakage current or cutoff current, comparatively small switching losses, and comparatively great robustness. Semiconductor device 10 is thus also usable for high-voltage applications, for example.

Based on one particular specific embodiment of semiconductor device 10, first semiconductor material 26 of the second conductivity type has a layer thickness 27 of approximately 10 nanometers (nm) to approximately 500 nm. For example, layer thickness 27 is approximately 70 nm. A doping concentration (for example, having an "Np" doping concentration) of first semiconductor material 26 of the second conductivity type is preferably approximately $10^{16}$ atoms per cubic centimeter volume to approximately $10^{17}$ atoms per cubic centimeter volume.

A second side 30 of semiconductor volume 12 which faces away from first side 16 covered with metal layer 14 is covered with an electrically conductive contact material 28. A partial volume 34 of semiconductor volume 12 adjoining contact material 28 is more strongly doped than remaining semiconductor volume 12 of the first conductivity type. Partial volume 34 is a so-called n+ substrate, for example. Electrically conductive contact material 28 is preferably a metal.

For example, it may be provided according to the present invention that the first conductivity type corresponds to an n-doped semiconductor material, and the second conductivity type corresponds to a p-doped semiconductor material. Metal layer 14 is part of a Schottky contact, and in this first case acts as an anode electrode. Similarly, contact material 28 forms an associated cathode electrode.

Alternatively, it may be provided according to the present invention that the first conductivity type corresponds to a p-doped semiconductor material, and the second conductivity type corresponds to an n-doped semiconductor material. In this alternative, the functions of anode and cathode are interchanged with respect to the described first case.

According to a first variant of semiconductor device 10 or according to a first manufacturing method, a particular area 36 of a base 38 of the particular trench 18 is filled with a second semiconductor material 40 corresponding to a depth dimension 48. Second semiconductor material 40 is a semiconductor material of the second conductivity type.

An ohmic contact results between metal layer 14 and second semiconductor material 40, and a PN junction, i.e., a PN diode, results between second semiconductor material 40 and semiconductor volume 12. This PN diode is electrically connected in parallel to the trench MOS barrier Schottky diode, which is formed with the aid of metal layer 14 and semiconductor volume 12. In the present case, area 36 is also referred to as a "trough," in particular as a "p trough". Semiconductor device 10 or the PN diode is preferably designed in such a way that an electrical "breakdown" takes place at base 38 of trenches 18. Second semiconductor material 40 is converted into second semiconductor material 40 of the second conductivity type, preferably beneath the particular trench 18, with the aid of ion implantation.

According to a second variant of semiconductor device 10 or according to a second manufacturing method, second semiconductor material 40 is a polycrystalline semiconductor material.

Alternatively, this may take place with the aid of a cover with a chemically trivalent (or pentavalent) element and subsequent diffusion into semiconductor volume 12. For example, this takes place with the aid of the chemical element boron. Alternatively, a so-called gas phase covering may take place. Likewise formed in semiconductor volume 12, in the area of base 38, is a PN diode which likewise is electrically connected in parallel to the trench MOS barrier Schottky diode formed with the aid of metal layer 14.

Metal layer 14 is used as an electrode, for example as a shared anode, for both the Schottky diode and the electrically parallel PN diode. In addition, it is apparent in FIG. 1 that a particular border area between metal layer 14 or metal 14a and semiconductor volume 12 of the first conductivity type includes, in sections, either oxide layer 22 or the layer made of first semiconductor material 26 of the second conductivity type or second semiconductor material 40 of the second conductivity type.

FIG. 2 shows a second specific embodiment of semiconductor device 10 having a trench MOS barrier Schottky diode and an integrated PN diode designed with the aid of second semiconductor material 40. In contrast to the first specific embodiment in FIG. 1, in the second specific embodiment in FIG. 2 a volume in the particular trench 18 enclosed by oxide layer 22 is filled with a polycrystalline semiconductor material 41 of the second conductivity type. Metal layer 14 is situated at a section of semiconductor material 41 shown at the top in the drawing, resulting in an electrically conductive connection (ohmic contact).

In the specific embodiment in FIG. 2, metal layer 14 is essentially separated from oxide layer 22. This may result in advantages for the service life of the trench MOS barrier Schottky diode according to the present invention.

The specific embodiment in FIG. 1 as well as the specific embodiment in FIG. 2 may also include additional structures, in each case in an edge area of semiconductor device 10 according to the present invention, for reducing a marginal field intensity. These may be, for example, low-doped areas, for example low-doped p areas, magnetoresistors, or similar structures corresponding to the related art.

As is likewise apparent from FIGS. 1 and 2, the comparatively thin first semiconductor material 26 is situated in each case directly between metal layer 14 and semiconductor volume 12 of the first conductivity type. This results not in a simple Schottky contact as in a conventional TMBS-PN, but, rather, a "Schottky contact system."

For the following description of further functional aspects, for the sake of simplicity the first conductivity type is assumed to be a particular n-doping, and the second conductivity type is assumed to be a particular p-doping. As already described above, the particular dopings may alternatively also be provided in an inverted manner. This also applies for the exemplary embodiments previously described with reference to FIGS. 1 and 2.

Note: In the present case, the "thin p layer" is generally referred to in the singular to indicate that in a particular current path, current passes only through exactly one thin p layer. It is understood that semiconductor device 10 according to the present invention, in particular due to trenches 18, preferably includes multiple such thin p layers (in parallel), which are thus separated from one another by trench 18 or trenches 18.

Example 1

If the aforementioned thin p layer made of first semiconductor material 26 of the second conductivity type has a comparatively thick design and is doped comparatively strongly, the Schottky contact is virtually completely shielded. Metal layer 14 on first side 16 ("front side") of semiconductor device 10 according to the present invention ("chip") forms an ohmic contact with the thin p layer. A resulting sequence of successive layers, namely, top metal layer 14, the thin p layer (semiconductor material 26), the n epilayer (semiconductor volume 12), and the n+ substrate (partial volume 34), functions similarly to a PiN diode. In this example, although comparatively low cutoff currents result, comparatively high conducting-state voltages at low current density, and comparatively large switching losses, also result.

Example 2

However, if the thin p layer has a particularly thin design and is doped weakly enough, the thin p layer is almost completely transparent to the Schottky contact. Metal layer 14 on first side 16 ("front side") of semiconductor device 10 forms a Schottky contact with the layer sequence "metal layer 14/thin p layer (semiconductor material 26)/n epilayer (semiconductor volume 12)." The layer sequence "metal layer 14/thin p layer (semiconductor material 26)/n epilayer (semiconductor volume 12)/n+ substrate (partial volume 34)" functions comparably to a Schottky diode. This results in comparatively high cutoff currents, comparatively high conducting-state voltages at high current density, and comparatively small switching losses.

In the present case, the thin p layer is then referred to as transparent when it is permeable to minority charge carriers in the present case of a p emitter for the electrons. For this purpose, on the one hand the barrier of this Schottky contact system, including the thin p layer, resulting from the doping concentration and layer thickness 27 must be low and thin enough that the electrons may be injected from the Schottky contact into semiconductor material 26 or into semiconductor volume 12 (silicon, for example). On the other hand, recombining of the minority charge carriers (electrons) on their way through the thin p layer must be minimized; i.e., a transit time of the electrons must be much less than the lifetime of their minority carriers.

Example 3

If the thickness and the doping concentration of the thin p layer are suitably designed (according to the present invention), important parameters such as, for example, the conducting-state voltages at high current density, the cutoff currents, and the switching losses may be predefined and optimized. In this case, the layer sequence "metal layer 14/thin p layer (semiconductor material 26)/n epilayer (semiconductor volume 12)/n+ substrate (partial volume 34)" functions as a Schottky diode with a partially transparent p layer. The optimization parameters for the p layer are its layer thickness 27 and its doping concentration "Np."

In particular, the present invention allows cutoff currents, in particular at high temperature, to be greatly reduced by creating the thin p layer directly beneath the Schottky contact, without at the same time having noticeable effects on the conducting-state voltage and the switching losses. This means that, on the one hand, the p layer is to be preferably thin and weakly doped in such a way that in conducting mode, almost no, or only slight, hole injection comes from the p layer, and thus, the charge carrier distribution corresponds essentially to the TSBS PN. On the other hand, this means that the thin p layer is to be comparatively thick and doped comparatively strongly in order to at least partially shield the Schottky contact in the reverse direction. Therefore, depending on the application requirements, the p layer as already described above is provided with a thickness in the range of 10 nm to 500 nm and a doping concentration in the range of $10^{16}$ to $10^{17}$ atoms per cubic centimeter volume.

In summary, the advantages of the present invention are stated or repeated below:

(a) In comparison to conventional high-voltage Schottky diodes:
  particularly low conducting-state voltages in the vicinity of high current densities are possible, since the conductivity of the weakly doped area is greatly increased by high-level injection of the integrated PN diode.
  comparatively low leakage currents due to shielding of the Schottky effect with the aid of the trench structure in combination with the thin p layer directly beneath the Schottky contact. In addition, comparatively great robustness results from the clamp function of the PN diode.

(b) In comparison to conventional high-voltage PiN diodes:
  comparatively low conducting-state voltage up to a high current density with the aid of a suitable barrier height of the Schottky contact in combination with high-level injection at high current density.
  comparatively small shutoff losses, since in conducting mode, fewer charge carriers are injected and stored in the weakly doped area due to the Schottky contact system (Schottky contact in combination with a thin p layer directly beneath the Schottky contact).

(c) In comparison to a further approach (so-called "cool SBD" diodes) from the related art:
  lower conducting-state voltage at high current density due to stronger high-level injection. Lower leakage currents due to effective shielding of the Schottky effect.

(d) In comparison to conventional TSBS PN without a thin p layer directly beneath the Schottky contact:
  particularly low leakage currents at virtually the same conducting-state voltage at high current density and virtually the same shutoff losses.

Figure 3:
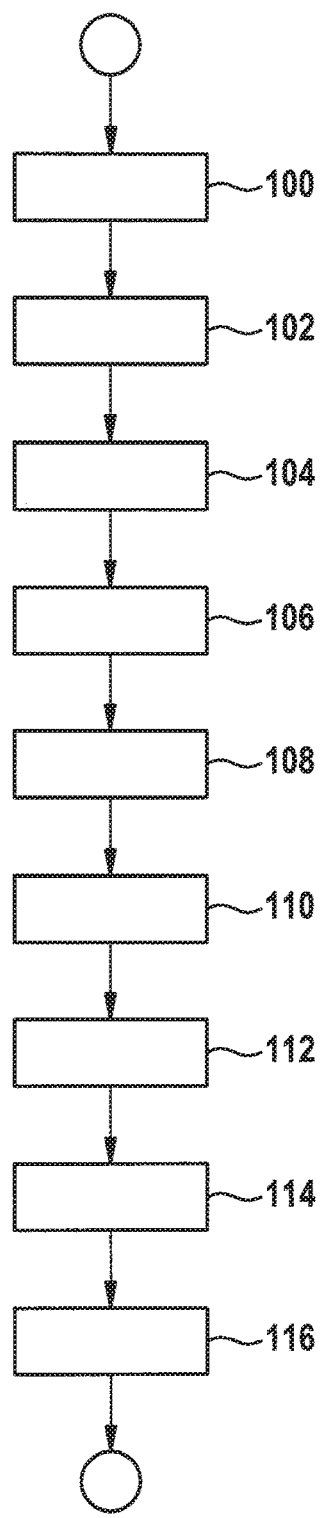
FIG. 3 shows a flow chart for a method for manufacturing the semiconductor device.

FIG. 3 shows a flow chart for a method for manufacturing semiconductor device 10 having a trench MOS barrier Schottky diode, characterized by the following steps:

A semiconductor volume 12 of the first conductivity type is created in a first method step 100, a partial volume 34 of semiconductor volume 12 being doped comparatively strongly (step 100: creation of a semiconductor volume 12).

At least one trench 18 is etched into semiconductor volume 12 in a further method step 102. Trenches 18 may be created, for example, in such a way that in the cross section they have a rectangular shape or a rectangular shape with a circular base, i.e., a U shape (step 102: etching of at least one trench 18).

Oxide layer 22 is created on at least one wall section 20 of trench 18 in a further method step 104 (step 104: creation of oxide layer 22).

At least a section of oxide layer 22, preferably in an area of base 38 of trench 18, is removed in a further method step 106 (step 106: removal of at least a section of oxide layer 22).

A semiconductor volume 12 of the second conductivity type, preferably in the area of base 38, is created in a further method step 108, using and doping semiconductor volume 12 with a dopant which increases the conductivity of the second conductivity type (step 108: creation of a semiconductor volume 12).

At least a portion of a remaining volume of the at least one trench 18 is filled with a metal (i.e., with a section of metal layer 14, for example) or a polycrystalline semiconductor material 41 of the second conductivity type, in a further method step 110 (filling a portion of a remaining volume of the at least one trench 18).

A layer made of semiconductor material 26 of the second conductivity type is created on semiconductor volume 12 of the first conductivity type on second side 30 of semiconductor volume 12 facing away from electrically conductive contact material 28, in a further method step 112 (step 112: creation of a layer made of semiconductor material 26 of the second conductivity type on semiconductor volume 12 of the first conductivity type).

Metal layer 14 is created on the layer made of semiconductor material 26 of the second conductivity type and on metal 14a or polycrystalline semiconductor material 41 of the second conductivity type, which fills at least a portion of the remaining volume of trench 18, in a further method step 114 (step 114: creation of metal layer 14).

Creation of electrically conductive contact material 28, in particular as a metal layer, and (optionally) carrying out additional manufacturing steps, such as bonding and/or housing and/or contacting of semiconductor device 10, takes place in a further method step 116. For example, semiconductor device 10 may include a solderable metal plating on the electrodes or component contacts. In addition, a specific embodiment including a press-in housing is possible according to the present invention (step 116: carrying out additional manufacturing steps such as bonding and/or housing and/or contacting of semiconductor device 10).

The method described with the aid of FIG. 3 is preferably carried out, at least in part, with the aid of an epitaxy process and/or with the aid of an etching process and/or with the aid of a diffusion process and/or with the aid of an ion implantation process.

What is claimed is:

1. A semiconductor device having a trench MOS barrier Schottky diode, comprising:
    a semiconductor volume of a first conductivity type, the semiconductor volume (i) having a first side which is covered with a metal layer, and (ii) including at least one trench which extends in the first side and is at least partially filled with at least one of metal and a semiconductor material of a second conductivity type, the trench having at least one wall section which includes an oxide layer, at least in areas;
    wherein at least one area, situated next to the trench, of the first side covered with the metal layer has a layer, situated between the metal layer and the semiconductor volume and above a trough area of the trench, made of a first semiconductor material of the second conductivity type,
    wherein the semiconductor volume includes at least two trenches,
    wherein the at least one area is between the at least two trenches,
    wherein the first semiconductor material of the second conductivity type has a layer thickness of approximately 10 nanometers (nm) to approximately 500 nm,
    wherein a doping concentration of the first semiconductor material of the second conductivity type is approximately $10^{16}$ atoms per cubic centimeter volume to approximately $10^{17}$ atoms per cubic centimeter volume, and
    wherein a second semiconductor material of the second conductivity type is provided below at least one area of a base of the at least one trench and is connected to the metal layer by one of: (i) an ohmic contact, and (ii) a polycrystalline material.

2. The semiconductor device as recited in claim 1, wherein the at least one area of the base of the at least one trench is converted into the second semiconductor material of the second conductivity type with ion implantation.

3. The semiconductor device as recited in claim 1, wherein a second side of the semiconductor volume, facing away from the first side covered with the metal layer, is covered with an electrically conductive contact material, and a partial volume of the semiconductor volume bordering the contact material is more strongly doped than the remaining semiconductor volume of the first conductivity type.

4. The semiconductor device as recited in claim 1, wherein the metal layer is separated in sections from the semiconductor volume of the first conductivity type, by one of (i) the oxide layer, (ii) the layer made of the first semiconductor material of the second conductivity type, or (iii) the second semiconductor material of the second conductivity type.

5. The semiconductor device as recited in claim 1, wherein a depth of the at least one trench is 1 micron (μm) to 4 μm, preferably approximately 2 μm.

6. The semiconductor device as recited in claim 1, wherein a ratio of a depth of one of the two trenches to a clearance between the two trenches is at least equal to 2.

7. The semiconductor device as recited in claim 1, wherein one of (i) the first conductivity type corresponds to an n-doped semiconductor material and the second conductivity type corresponds to a p-doped semiconductor material, or (ii) the first conductivity type corresponds to a p-doped semiconductor material and the second conductivity type corresponds to an n-doped semiconductor material.

* * * * *